(12) United States Patent
Tsuchida

(10) Patent No.: US 6,232,823 B1
(45) Date of Patent: May 15, 2001

(54) VOLTAGE SETTING CIRCUIT IN A SEMICONDUCTOR INTEGRATED CIRCUIT

(75) Inventor: Kazuhito Tsuchida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/500,638

(22) Filed: Feb. 9, 2000

(30) Foreign Application Priority Data

Sep. 1, 1999 (JP) .................................................. 11-247462

(51) Int. Cl.[7] .................................................. H01H 37/76
(52) U.S. Cl. .................................................. 327/525
(58) Field of Search .................................. 327/308, 530, 327/525

(56) References Cited

U.S. PATENT DOCUMENTS 5,150,216 * 9/1992 Tokitou et al. .................. 358/213.11
5,151,611 * 9/1992 Rippey .............................. 307/202.1
5,361,001 * 11/1994 Stolfa ................................... 327/530

FOREIGN PATENT DOCUMENTS 7-147202  6/1995 (JP).
9-205010  8/1997 (JP).

* cited by examiner

Primary Examiner—Jeffrey Zweizig
(74) Attorney, Agent, or Firm—Leydig, Voit & Mayer, Ltd.

(57) ABSTRACT

Each of a first series element, a second series element, a third series element, and a fourth series element includes a trimming fuse having a small resistance and a resistor serially connected to each other. A first reference voltage is applied to a first end of the first series element, a first end of the second series element is connected to a second end of the first series element, a second end of the second series element is grounded, a first end of the third series element is connected to the first end of the first series element, a first end of the fourth series element is connected to a second end of the third series element, a second end of the fourth series element is connected to the second end of the second series element, a first independent resistor connects the first end of the first series element and the second end of the third series element, and a voltage at the second end of the third series element is output. Therefore, the choices in the output voltage can be increased while suppressing an increase in the area occupied by the resistors.

14 Claims, 7 Drawing Sheets

VOLTAGE SETTING CIRCUIT IN A SEMICONDUCTOR INTEGRATED CIRCUIT

BACKGROUND OF THE INVENTION

1. Field of the Invention

The present invention relates to a voltage setting circuit used for setting an arbitrary voltage, adjusted by trimming a fuse, in a semiconductor integrated circuit.

2. Description of Related Art

FIG. 11 is a constitutional view of a conventional voltage setting circuit.

As shown in FIG. 11, a conventional voltage setting circuit arranged in a semiconductor integrated circuit is composed of a resistor 2 of a resistance valuer $r_2$, a resistor 3 of a resistance value $r_3$, a resistor 4 of a resistance value $r_4$ and a resistor 5 of a resistance value $r_5$ arranged in series in that order, a trimming fuse 7 arranged in parallel to the resistor 2, a trimming fuse 8 arranged in parallel to the resistor 5, and an output terminal 9 for outputting an output voltage $V_0$ of a connection point between the resistors 3 and 4. A first reference voltage 1 of a voltage value $Vref_1$ is applied to the resistor 2, a second first reference voltage 6 of a voltage value $Vref_2$ is applied to the resistor 5. The trimming fuses 7 and 8 respectively have a very small resistance value as compared with the resistance values $r_2$ to $r_5$.

An operation of the voltage setting circuit is described. Because the resistance values of the trimming fuses 7 and 8 are very small, the output voltage value $V_0$ of the output terminal 9 is expressed as follows.

$$V_0 = (Vref_1 - Vref_2)/(r_3 + r_4) * r_4 + Vref_2 \quad (1)$$

After a wafer process for manufacturing the voltage setting circuit is completed, the trimming fuse 7 or 8 is normally trimmed (or laser-cut) by using a laser beam to adjust the output voltage Vo of the output terminal 9.

In cases where the trimming fuse 7 is trimmed, the output voltage $V_0$ is expressed as follows.

$$V_0 = (Vref_1 - Vref_2)/(r_2 + r_3 + r_4) * r_4 + Vref_2 \quad (2)$$

Also, in cases where the trimming fuse 8 is trimmed, the output voltage value $V_0$ is expressed as follows.

$$V_0 = (Vref_1 - Vref_2)/(r_3 + r_4 + r_5) * (r_4 + r_5) + Vref_2 \quad (3)$$

Therefore, the output voltage $V_0$ at the output terminal 9 can be adjusted by appropriately trimming one of the trimming fuses 7 and 8. In this case, the number of choices in the output voltage $V_0$ is 3 according to three equations (1), (2) and (3) by trimming one of the trimming fuses 7 and 8 in the voltage setting circuit using the four resistors 2 to 5.

In general, in cases where the number of choices in the output voltage is increased, even though the resistors of the voltage setting circuit are not uniformly formed in the wafer process, the voltage setting circuit in which the output voltage $V_0$ is precisely set can be provided. Therefore, as shown in FIG. 12, in a second conventional voltage setting circuit, two resistors 11 and 12 of resistance values $r_{11}$ and $r_{12}$ are added, and two trimming fuses 13 and 14 having very small resistance values are added to be parallel to the resistors 11 and 12. In this voltage setting circuit, the number of choices is 5. Also, in cases where a plurality of trimming fuses can be trimmed, the number of choices is increased to 16. Therefore, because the number of choices in the output voltage $V_0$ is increased, even though the resistors are not uniformly formed, a voltage setting circuit in which an output voltage $V_0$ is precisely set can be provided.

However, in the above conventional voltage setting circuits, though the number of choices in the output voltage can be increased as the number of resistors is increased, an area occupied by the resistors is increased as the number of resistors is increased. Therefore, there is a drawback that a size of the semiconductor integrated circuit is increased.

Also, in cases where values of the output voltage $V_0$ are set at equal intervals, it is convenient to adjust the output voltage $V_0$ after the completion of the wafer process.

However, to set values of the output voltage $V_0$ at equal intervals, it is required to precisely set the resistance values $r_2$ to $r_5$ of the resistors 2 to 5 to different values in a design step, so that there is another drawback that the resistance value design for the voltage setting circuit is troublesome.

Also, to obtain the output voltage $V_0$ with a high precision, it is required to precisely set the resistance values of the resistors. Therefore, there is another drawback that it is difficult to obtain the output voltage $V_0$ with a high precision after the completion of the wafer process.

SUMMARY OF THE INVENTION

To solve the above drawbacks, a first object of the present invention is to provide a voltage setting circuit in which the number of choices in the output voltage is increased while suppressing the increase of an area occupied by resistors.

Also, a second object is to provide a voltage setting circuit in which a plurality of output voltage values obtainable are set at equal intervals or at almost equal intervals without setting resistance values of resistors to different values.

Also, a third object is to provide a voltage setting circuit in which an output voltage is easily obtained with a high precision after the completion of a wafer process.

To achieve the first object, a voltage setting circuit comprises a first series element, made of a first trimming fuse and a first resistor, in which a first reference voltage is applied to a first end thereof;

a second series element, made of a second trimming fuse and a second resistor, in which a first end thereof is connected with a second end of the first series element and a second reference voltage is applied to a second end thereof;

a third series element, made of a third trimming fuse and a third resistor, in which a first end thereof is connected with the first end of the first series element;

a fourth series element, made of a fourth trimming fuse and a fourth resistor, in which a first end thereof is connected with a second end of the third series element and a second end thereof is connected with the second end of the second series element;

a first independent resistor in which a first end thereof is connected with the second end of the first series element and a second end thereof is connected with the second end of the third series element; and a voltage output terminal for outputting a terminal voltage of the second end of the third series element.

In the above configuration, because the first, second, third and fourth series elements and the first independent resistors are arranged in the H shape, the number of choices in the voltage output from the voltage output terminal becomes 5 in the voltage setting circuit using five resistors. Therefore, the number of choices in the output voltage can be increased while suppressing the increase of an area occupied by the resistors.

To achieve the second object, it is preferred that the first resistor, the second resistor, the third resistor, the fourth resistor and the first independent resistor be set to the same resistance value.

In this invention, 5 types of output voltage values obtainable are set at equal intervals without setting resistance values of the resistors to different values. Therefore, the manufacturing of the voltage setting circuit can be simplified, and the output voltage can be easily adjusted.

Also, it is preferred that the voltage setting circuit further comprise voltage multiplying means for multiplying the first reference voltage or the second reference voltage to a multiplied reference voltage according to a terminal voltage applied to the second end of the first series element, wherein the multiplied reference voltage at the first end of the first series element or at the second end of the second series element is output from the voltage output terminal.

In this invention, because the voltage applied to the second end of the first series element is changed by trimming one of the trimming fuses, one voltage value can be selected from a plurality of values of the multiplied reference voltage. Therefore, one output voltage value can be selected from a plurality of output voltage values agreeing with values of the multiplied reference voltage.

Also, it is preferred that the voltage setting circuit further comprise
  a fifth series element, made of a fifth trimming fuse and a fifth resistor, in which a first end thereof is connected with the first end of the first series element and the first end of the third series element;
  a sixth series element, made of a sixth trimming fuse and a sixth resistor, in which a first end thereof is connected with a second end of the fifth series element and a second end thereof is connected with the second end of the second series element and the second end of the fourth series element; and
  a second independent resistor in which a first end thereof is connected with the second end of the third series element and a second end thereof is connected with the second end of the fifth series element, wherein the voltage output terminal outputs a terminal voltage of the second end of the fifth series element.

In the above configuration, the fifth and sixth series elements are additionally arranged in parallel to the first, second, third and fourth series elements arranged in the H shape, and the second independent resistor is additionally arranged between the second ends of the third and fifth series elements. Therefore, the number of choices in the output voltage can be moreover increased.

To achieve the second object, in the voltage setting circuit including the fifth and sixth series elements and the second independent resistor, it is preferred that the first and second resistors and the first independent resistor be set to the same resistance value, the third and fourth resistors and the second independent resistor be set to the same resistance value which is twice as high as that of the first and second resistors, and the fifth and sixth resistors be set to the same resistance value which is four times as high as that of the first and second resistors.

In this invention, a plurality of output voltage values obtainable at the voltage output terminal are set at equal intervals without setting resistance values of the resistors to different values. Therefore, the manufacturing of the voltage setting circuit can be simplified, and the output voltage can be easily adjusted.

Also, in the voltage setting circuit including the fifth and sixth series elements and the second independent resistor, it is preferred that the voltage setting circuit further comprise voltage multiplying means for multiplying the first reference voltage or the second reference voltage to a multiplied reference voltage according to a terminal voltage applied to the second end of the first series element, wherein the multiplied reference voltage at the first end of the first series element or at the second end of the second series element is output from the voltage output terminal.

In the above configuration, because the terminal voltage applied to the second end of the first series element is changed by trimming one of the trimming fuses, one voltage value can be selected from a plurality of values of the multiplied reference voltage. Therefore, one output voltage value can be selected from a plurality of output voltage values agreeing with values of the multiplied reference voltage.

To achieve the first and third objects, a voltage setting circuit comprises
  a first independent resistor, having a resistance value, in which a first reference voltage is applied to a first end thereof;
  a first series element, made of a first trimming fuse and a first resistor having a resistance value lower than that of the first independent resistor, in which a first end thereof is connected with a second end of the first independent resistor;
  a second series element, made of a second trimming fuse and a second resistor having a resistance value lower than that of the first independent resistor, in which a first end thereof is connected with a second end of the first series element and a second reference voltage is applied to a second end thereof;
  a third series element, made of a third trimming fuse and a third resistor having a resistance value lower than that of the first independent resistor, in which a first end thereof is connected with the second end of the first independent resistor;
  a fourth series element, made of a fourth trimming fuse and a fourth resistor having a resistance value lower than that of the first independent resistor, in which a first end thereof is connected with a second end of the third series element;
  a second independent resistor, having a resistance value higher than those of the first, second, third and fourth resistors, in which a first end thereof is connected with a second end of the second series element and a second end of the fourth series element;
  a third independent resistor, having a resistance value lower than those of the first and second independent resistors, in which a first end thereof is connected with the second end of the first series element and a second end thereof is connected with the second end of the third series element; and
  a voltage output terminal for outputting a terminal voltage of the second end of the third series element.

In the above configuration, because the first, second, third and fourth series elements and the third independent resistor are arranged in the H shape, the number of choices in the voltage output from the voltage output terminal becomes 5 by using five resistors. Therefore, the number of choices in the output voltage can be increased while suppressing the increase of an area occupied by the resistors.

Also, because the first and second independent resistors have resistance values higher than those of the first, second, third and fourth resistors and that of the third independent resistor, resistance values of the first and second independent resistors can be precisely set as compared with those of the other resistors, and a major part of the output voltage is determined by the first and second independent resistors precisely set. Therefore, an output voltage of the voltage output terminal can be easily set with a high precision after the completion of a wafer process.

To achieve the second object, it is preferred that the first resistor, the second resistor, the third resistor, the fourth resistor and the third independent resistor be set to the same resistance value as those of the other resistors.

In this invention, 5 types of output voltage values obtainable are set at equal intervals without setting resistance values of the resistors to different values. Therefore, the manufacturing of the voltage setting circuit can be simplified, and the output voltage can be easily adjusted.

Also, it is preferred that the voltage setting circuit further comprise voltage multiplying means for multiplying the first reference voltage or the second reference voltage to a multiplied reference voltage according to a terminal voltage applied to the second end of the first series element, wherein the multiplied reference voltage at the first end of the first independent resistor or at the second end of the second independent resistor is output from the voltage output terminal.

In the above configuration, because the terminal voltage applied to the second end of the first series element is changed by trimming one of the trimming fuses, one voltage value can be selected from a plurality of values of the multiplied reference voltage. Therefore, one output voltage value can be selected from a plurality of output voltage values agreeing with values of the multiplied reference voltage.

Also, it is preferred that the voltage setting circuit further comprise a fifth series element, made of a fifth trimming fuse and a fifth resistor having a resistance value lower than those of the first and second independent resistors, in which a first end thereof is connected with the first end of the first series element and the first end of the third series element;

a sixth series element, made of a sixth trimming fuse and a sixth resistor having a resistance value lower than those of the first and second independent resistors, in which a first end thereof is connected with a second end of the fifth series element and a second end thereof is connected with the second end of the second series element and the second end of the fourth series element; and a fourth independent resistor, having a resistance value lower than those of the first and second independent resistors, in which a first end thereof is connected with the second end of the third series element and a second end thereof is connected with the second end of the fifth series element, wherein the voltage output terminal outputs a terminal voltage of the second end of the fifth series element.

In the above configuration, the fifth and sixth series elements are additionally arranged in parallel to the first, second, third and fourth series elements arranged in the H shape, and the fourth independent resistor is additionally arranged between the second ends of the third and fifth series elements. Therefore, the number of choices in the output voltage can be moreover increased.

To achieve the second object, in the voltage setting circuit including the fifth and sixth series elements and the fourth independent resistor, it is preferred that the first and second resistors and the first independent resistor be set to the same resistance value, the third and fourth resistors and the second independent resistor be set to the same resistance value which is twice as high as that of the first and second resistors, and the fifth and sixth resistors be set to the same resistance value which is four times as high as that of the first and second resistors.

In this invention, a plurality of output voltage values obtainable at the voltage output terminal are set at equal intervals without setting resistance values of the resistors to different values. Therefore, the manufacturing of the voltage setting circuit can be simplified, and the output voltage can be easily adjusted.

Also, it is preferred that the voltage setting circuit further comprise voltage multiplying means for multiplying the first reference voltage or the second reference voltage to a multiplied reference voltage according to a terminal voltage applied to the second end of the first series element, wherein the multiplied reference voltage at the first end of the first independent resistor or at the second end of the second independent resistor is output from the voltage output terminal.

In the above configuration, because the terminal voltage applied to the second end of the first series element is changed by trimming one of the trimming fuses, one voltage value can be selected from a plurality of values of the multiplied reference voltage. Therefore, one of a plurality of output voltage values agreeing with values of the multiplied reference voltage can be selected.

Also, it is preferred that the trimming fuse and the resistor in each of the first series element, second series element, the third series element and the fourth series element be serially connected with each other. Also, it is preferred that the trimming fuse and the resistor in each of the fifth series element and the sixth series element be serially connected with each other.

In this invention, in cases where the trimming fuse is trimmed, as no current flows the corresponding resistor in each series element, the value of the output voltage can be changed.

DETAILED DESCRIPTION OF THE PREFERRED EMBODIMENTS

The invention will now be described with reference to the accompanying drawings.

EMBODIMENT 1

Figure 1:
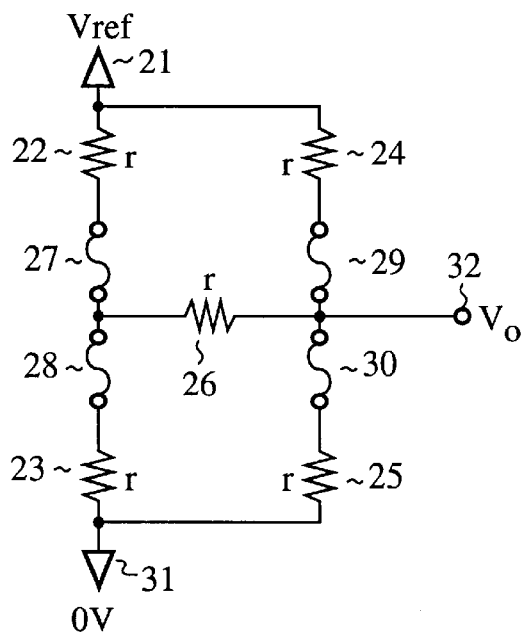
FIG. 1 is a schematic view of a voltage setting circuit according to a first embodiment of the present invention.

FIG. 1 is a schematic view of a voltage setting circuit according to a first embodiment of the present invention.

As shown in FIG. 1, a first series element is composed of a resistor 22 and a trimming fuse 27 serially connected with each other, a second series element is composed of a resistor 23 and a trimming fuse 28 serially connected with each other, a third series element is composed of a resistor 24 and a trimming fuse 25 serially connected with each other, and a fourth series element is composed of a resistor 25 and a trimming fuse 30 serially connected with each other. Resistance values of the trimming fuses 27 to 30 are considerably lower than a resistance value r of the resistors 22 to 25, so that a resistance value of each series element is represented by the resistance value r of the corresponding resistor in cases where the corresponding trimming fuse is not trimmed.

A voltage setting circuit comprises the first series element in which a first end thereof is connected with a first reference terminal 21 set to a first reference voltage $V_{ref}$, the second series element in which a first end thereof is connected with a second end of the first series element and a second reference terminal 31 set to a second reference voltage is applied to a second end thereof, the third series element in which a first end thereof is connected with the first end of the first series element, the fourth series element in which a first end thereof is connected with a second end of the third series element and a second end thereof is connected with the second end of the second series element, a first independent resistor 26 in which a first end thereof is connected with the second end of the first series element and a second end thereof is connected with the second end of the third series element, and an output terminal 32 for outputting a terminal voltage of the second end of the third series element.

The first independent resistor 26 has the same resistance value r as that of the resistors 22 to 25. The second reference terminal 31 is grounded, so that the second reference voltage is set to 0 for convenience.

In the above configuration, an operation of the voltage setting circuit is described.

Because the resistance values of the trimming fuses 27 to 30 is considerably lower than the resistance value r of the resistors 22 to 26, in cases where any trimming fuse is not trimmed, an output voltage $V_0$ at the output terminal 32 is expressed as follows.

$$V_0 = V_{ref}/(r/2 + r/2) * (r/2) \qquad (4)$$
$$= V_{ref}/2$$

After a wafer process for manufacturing the voltage setting circuit is completed, one of the trimming fuses 27 to 30 is normally trimmed (or laser-cut) by using a laser beam to adjust the output voltage $V_0$ of the output terminal 32. Therefore, five values of the output voltage $V_0$ can be set at equal intervals. That is, a user can select one of the output voltage values.

In detail, in cases where one of the trimming fuses 27 to 30 is trimmed, the choices in the output voltage $V_0$ are expressed as follows.

$$V_0 = V_{ref}/\{r + (2r*r)/(2r+r)\} * (2r*r)/(2r+r) \qquad (5)$$
$$= 2/5 * V_{ref} \text{ (only the trimming fuse 27 is trimmed)}$$

$$V_0 = V_{ref}/\{r + (2r*r)/(2r+r)\} * (2r*r)/(2r+r) * 1/2 \qquad (6)$$
$$= 1/5 * V_{ref} \text{ (only the trimming fuse 29 is trimmed)}$$

$$V_0 = V_{ref}/\{(2r*r)/(2r+r) + r\} * r \qquad (7)$$
$$= 3/5 * V_{ref} \text{ (only the trimming fuse 28 is trimmed)}$$

$$V_0 = (V_{ref} - (V_{ref}/((2r*r)/(2r+r) + r) * r)) * 1/2 + \qquad (8)$$
$$V_{ref}/\{(2r*r)/(2r+r) + r\} * r$$
$$= 4/5 * V_{ref} \text{ (only the trimming fuse 30 is trimmed)}$$

Accordingly, because the first, second, third and fourth series elements and the first independent resistor 26 are arranged in an H shape, one output voltage value can be selected from five output voltage values in the voltage setting circuit using five resistors, so that the number of choices in the output voltage $V_0$ can be increased while suppressing the increase of an area occupied by the resistors.

Also, because the resistors 22 to 26 are set to the same resistance value r, the values $V_0$ of the output voltage can be set at equal intervals. As a result, the manufacturing of the voltage setting circuit can be simplified, and the output voltage $V_0$ can be easily adjusted by selecting one of the voltage values.

EMBODIMENT 2

Figure 2:
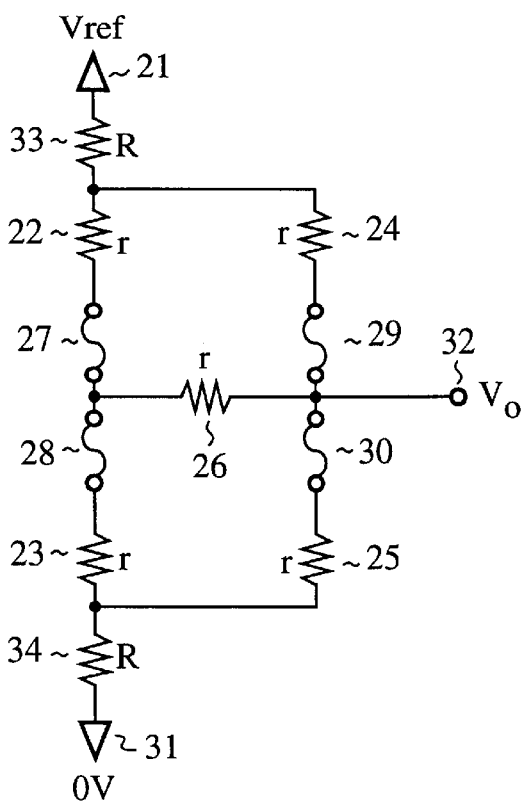
FIG. 2 is a schematic view of a voltage setting circuit according to a second embodiment of the present invention.

FIG. 2 is a schematic view of a voltage setting circuit according to a second embodiment of the present invention. The description of composing elements indicated by reference numerals, which are the same as those used in FIG. 1, is omitted hereinafter because the composing elements of any drawings are the same as or equivalent to those of FIG. 1 indicated by the same reference numerals as those in the drawings.

As compared with the voltage setting circuit shown in FIG. 1, a voltage setting circuit shown in FIG. 2 further comprises a first independent resistor 33, having a resistance value R considerably higher than that of the resistors 22 to 26, in which a first end thereof is connected with the first reference terminal 21 of the first reference voltage $V_{ref}$ and a second end thereof is connected with the first ends of the first and third series elements; and a second independent resistor 34, having the resistance value R, in which a first end thereof is connected with the second ends of the second and fourth series elements and a second end thereof is connected with the second reference terminal 31.

In this embodiment, the independent resistor 26 is called a third independent resistor. Also, the resistance value R of the first and second independent resistors 33 and 34 can be precisely set in a wafer process because the resistance value R is considerably higher than that of the resistors 22 to 26.

In the above configuration, an operation of the voltage setting circuit is described.

Because the resistance value R of the first and second independent resistors 33 and 34 is sufficiently higher than that of the resistors 22 to 26, a major part of the output voltage $V_0$ is determined by the first and second independent resistors 33 and 34 precisely formed, and the remaining part of the output voltage $V_0$ is determined by the resistors 22 to 26. Therefore, when one of the trimming fuses 27 to 30 is trimmed, not only five values of the output voltage $V_0$ can be set at almost equal intervals, but also the output voltage can be easily set with a high precision after the completion of a wafer process.

In detail, in cases where any trimming fuse is not trimmed, the output voltage $V_0$ is expressed as follows.

$$V_0 = V_{ref} / \{(R + r/2) * 2\} * (R + r/2) \quad (9)$$
$$= V_{ref}/2$$

Also, in cases where one trimming fuse is trimmed, the output voltage $V_0$ is expressed as follows.

$$V_0 = V_{ref} / \{(R + r) + (R + (2r*r)/(2r + r))\} * \quad (10)$$
$$\{R + (2r*r)/(2r+r)\}$$
$$= V_{ref} / \{2*R + (5/3)*r\} * \{R + (2/3)*r\}$$

(the trimming fuse 27 is only trimmed)

$$V_0 = V_{ref} / \{(R + r) + (R + (2r*r)/(2r + r))\} * \quad (11)$$
$$\{(2r*r)/(2r+r)\} * (1/2) +$$
$$V_{ref} / \{(R + r) + (R + (2r*r)/(2r + r))\} * R$$
$$= V_{ref} / \{2*R + (5/3)*r\} * \{R + (1/3)*r\}$$

(the trimming fuse 29 is only trimmed)

$$V_0 = V_{ref} / \{(R + r) + (R + (2r*r)/(2r + r))\} * (R + r) \quad (12)$$
$$= V_{ref} / \{2*R + (5/3)*r\} * (R + r)$$

(the trimming fuse 28 is only trimmed)

$$V_0 = V_{ref} / \{(R + r) + (R + (2r*r)/(2r + r))\} * \quad (13)$$
$$\{(2r*r)/(2r+r)\} * (1/2) +$$
$$V_{ref} / \{(R + r) + (R + (2r*r)/(2r + r))\} * (R + r)$$
$$= V_{ref} / \{2*R + (5/3)*r\} * \{R + (4/3)*r\}$$

(the trimming fuse 30 is only trimmed)

Therefore, in cases where only one trimming fuse is trimmed, one output voltage value can be selected from four output voltage values. That is, in cases where only one trimming fuse is trimmed or no trimming fuse is trimmed, one output voltage value can be selected from five output voltage values.

For example, in cases where $V_{ref}$=5 V, R=250 KΩ and r=3 KΩ are satisfied, the choices in the output voltage $V_0$ are as follows.

$V_0$=2.500 V (no trimming)
$V_0$=2.495 V (the trimming fuse 27 is only trimmed)
$V_0$=2.485 V (the trimming fuse 29 is only trimmed)
$V_0$=2.505 V (the trimming fuse 28 is only trimmed)
$V_0$=2.515 V (the trimming fuse 30 is only trimmed)

Figure 12:
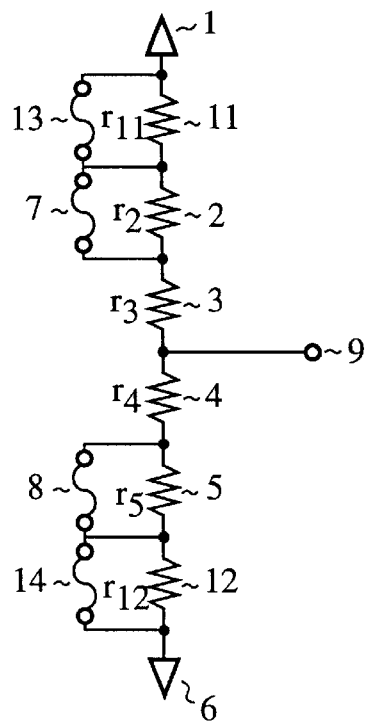
FIG. 12 is a schematic view of another conventional voltage setting circuit.

In the conventional voltage setting circuit shown in FIG. 12, one output voltage value can be selected from four types of output voltage values by trimming (or laser-cutting) only one trimming fuse. To select one output voltage value from the above output voltage values in the conventional voltage setting circuit, it is required to satisfy $r_3=r_4$=250 KΩ, $r_{11}=r_{12}$=3 KΩ and $r_2=r_5$=KΩ in the conventional voltage setting circuit. In general, the diffusion resistance obtained in a semiconductor wafer process is ranged from several hundreds Ω to 1 KΩ per a unit area. Therefore, a setting precision of a resistance value 1 KΩ in the wafer process becomes worse than that of a resistance value of several KΩ. To precisely set a resistance value of 1 KΩ in the wafer process, it is required to connect several resistors having resistance values of several KΩ with each other in parallel. For example, three resistors respectively having a resistance value of 3 KΩ are required to obtain a resistance value of 1 KΩ.

Therefore, in the conventional voltage setting circuit shown in FIG. 12, because two resistors $r_2$ and $r_5$ of 1 KΩ are used, eight resistors respectively having the resistance value of 3 KΩ are required to obtain the resistors $r_2$, $r_5$, $r_{11}$ and $r_{12}$. In contrast, in the voltage setting circuit shown in FIG. 2, five resistors respectively having the resistance value of 3 KΩ are required.

As a result, an area occupied by the resistors in the voltage setting circuit shown in FIG. 2 becomes smaller than that in the conventional voltage setting circuit shown in FIG. 12, so that a small-sized voltage setting circuit can be obtained according to the second embodiment.

Accordingly, because the first and second independent resistors 33 and 34 determining a major part of the output voltage $V_0$ are precisely formed in the wafer process, the major part of the output voltage $V_0$ is precisely set, the remaining part of the output voltage $V_0$ is determined by the resistors 22 to 26, so that the output voltage $V_0$ precisely set can be easily and reliably obtained after the completion of the wafer process.

Also, in the same manner as in the first embodiment, because the series elements and the third independent resistor 26 are arranged in the H shape, the number of choices in the output voltage $V_0$ can be increased while suppressing the increase of an area occupied by the resistors. Also, because the resistors 22 to 26 are set to the same resistance value r, the values $V_0$ of the output voltage can be set at equal intervals. As a result, the manufacturing of the voltage setting circuit can be simplified, and the output voltage $V_0$ can be easily adjusted by selecting one of the voltage values.

EMBODIMENT 3

Figure 3:
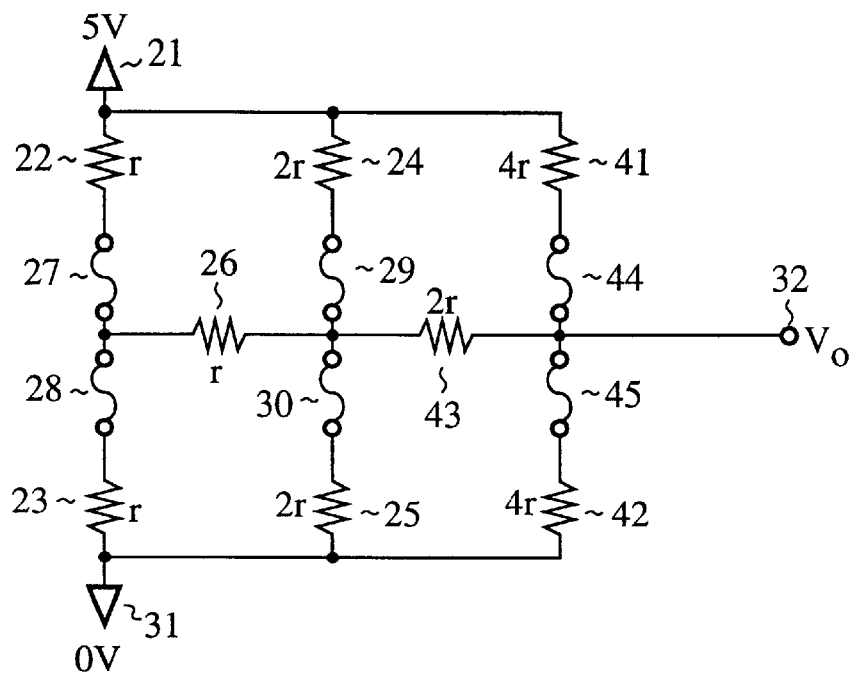
FIG. 3 is a schematic view of a voltage setting circuit according to a third embodiment of the present invention.

FIG. 3 is a constitutional view of a voltage setting circuit according to a third embodiment of the present invention.

As compared with the voltage setting circuit shown in FIG. 1, a voltage setting circuit shown in FIG. 3 further comprises a fifth series element, made of a fifth trimming fuse 44 and a fifth resistor 41, in which a first end thereof is connected with the first end of the first series element and the first end of the third series element;

a sixth series element, made of a sixth trimming fuse 45 and a sixth resistor 42, in which a first end thereof is connected with a second end of the fifth series element and a second end thereof is connected with the second end of the second series element and the second end of the fourth series element; and a second independent resistor 43 in which a first end thereof is connected with the second end of the third series element and a second end thereof is connected with the second end of the fifth series element, wherein the voltage output terminal outputs a terminal voltage. of the second end of the fifth series element.

In the above configuration, an operation of the voltage setting circuit is described.

The number of parallel elements, which each are composed of two series elements serially connected with each other, is increased by one as compared with that in the first embodiment.

In detail, to set a plurality of values of the output voltage $V_0$ at equal intervals, resistance values $r_{22}$ to $r_{26}$ of the resistors 22 to 26 and resistance values $r_{41}$ to $r_{43}$ of the resistors 41 to 43 are set to a following condition.

$r_{22}=r_{23}=r_{26}=r$ $r_{24}=r_{25}=r_{43}=2r$ $r_{41}=r_{42}=4r$

In this condition, in cases where the first reference voltage is set to 5 V and the second reference voltage is set to 0 V, following values of the output voltage $V_O$ are obtained in cases where two trimming fuses are trimmed (or laser-cut).

$V_O$=2.500 V (no trimming)

$V_O$=1.000 V (the trimming fuses 27 and 44 are trimmed)

$V_O$=1.500 V (the trimming fuses 27 and 29 are trimmed)

$V_O$=2.000 V (the trimming fuses 28 and 44 are trimmed)

$V_O$=3.000 V (the trimming fuses 27 and 45 are trimmed)

$V_O$=3.500 V (the trimming fuses 28 and 30 are trimmed)

$V_O$=4.000 V (the trimming fuses 28 and 45 are trimmed)

Figure 4:
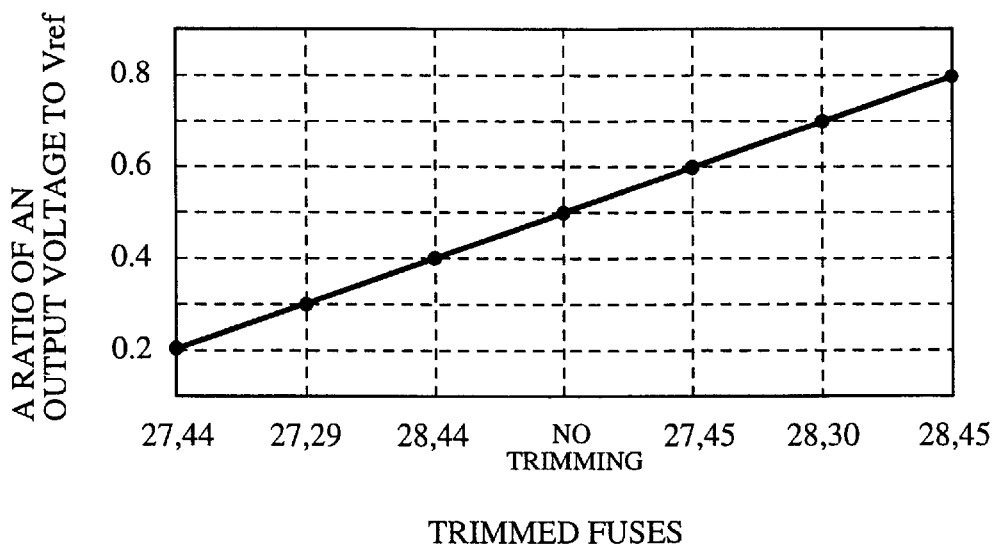
FIG. 4 is a graph showing a ratio of an output voltage to a reference voltage with respect to trimmed fuses.

Therefore, the values of the output voltage $V_O$ are set at equal intervals. The output voltage values set at equal intervals are shown in FIG. 4.

Accordingly, because the fifth and sixth series elements are arranged in parallel to the H-shaped arrangement of the first to fourth series elements to increase the number of parallel elements by one, the choices in the output voltage $V_O$ can be moreover increased.

In this embodiment, the number of parallel elements is increased by one. However, the present invention is not limited to this embodiment, and it is applicable that the number of parallel elements is increased by two or more. However, because an area occupied by resistors is enlarged as the number of parallel elements is increased, it is impossible to increase the parallel elements infinitely.

EMBODIMENT 4

Figure 5:
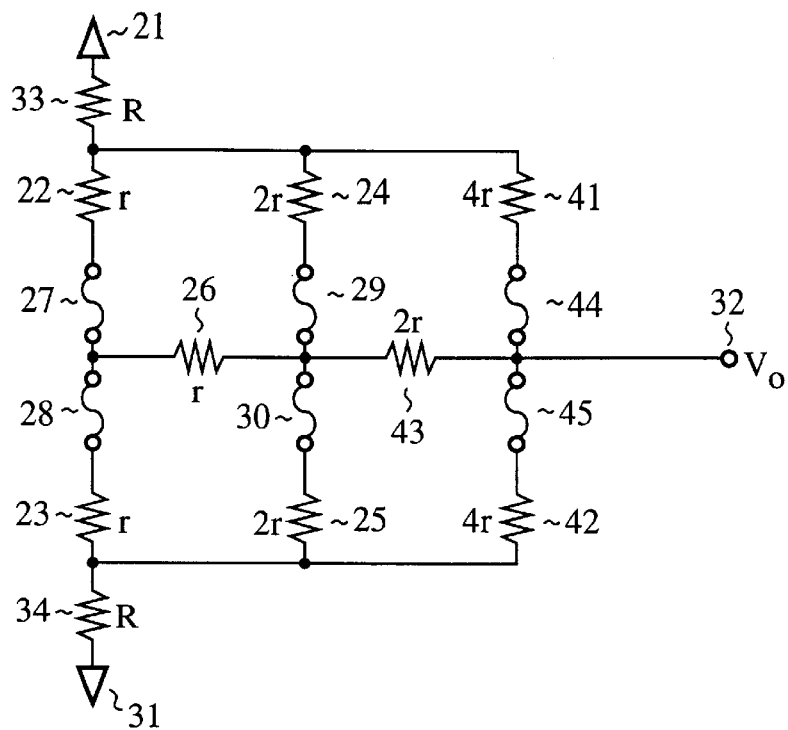
FIG. 5 is a schematic view of a voltage setting circuit according to a fourth embodiment of the present invention.

FIG. 5 is a constitutional view of a voltage setting circuit according to a fourth embodiment of the present invention.

As compared with the voltage setting circuit shown in FIG. 2, a voltage setting circuit shown in FIG. 5 further comprises the fifth series element, the sixth series element and a fourth independent resistor 43 which is the same as the second independent resistor 43 used in the third embodiment.

The number of parallel elements is increased by one as compared with that in the second embodiment.

Therefore, not only the output voltage $V_O$ precisely set can be easily and reliably obtained after the completion of the wafer process, but also the choices in the output voltage $V_O$ can be moreover increased.

EMBODIMENT 5

Figure 6:
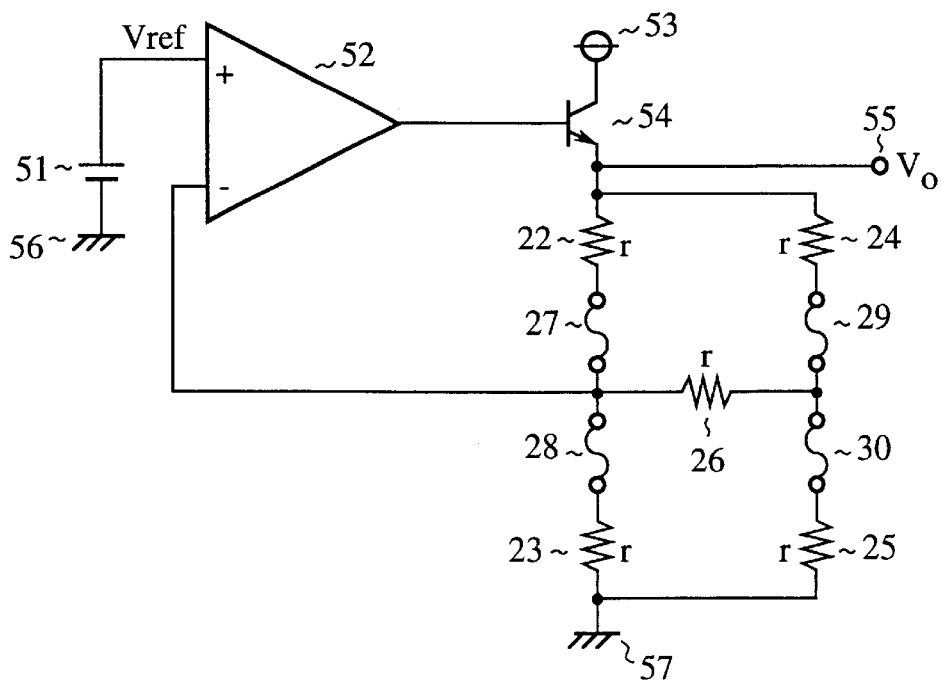
FIG. 6 is a schematic view of a voltage setting circuit according to a fifth embodiment of the present invention.

FIG. 6 is a constitutional view of a voltage setting circuit according to a fifth embodiment of the present invention.

As compared with the voltage setting circuit shown in FIG. 1, a voltage setting circuit shown in FIG. 6 further comprises a voltage multiplying unit 51 to 54 for multiplying the first reference voltage $V_{ref}$ according to a terminal voltage applied to the second end of the first series element, wherein a terminal voltage at the first end of the first series element is output from an output terminal 55.

The voltage multiplying unit comprises a voltage source 51, grounded at the ground 56, for generating the first reference voltage $V_{ref}$, an operational amplifier 52 for outputting an operation voltage according to the first reference voltage $V_{ref}$ and the terminal voltage applied to the second end of the first series element, an electric source 53, an output transistor 54 for producing a multiplied reference voltage, determined by multiplying the first reference voltage $V_{ref}$, from a voltage applied by the electric source 53 according to the operation voltage output from the operational amplifier 52 and outputting the multiplied reference voltage to the first end of the first series element.

The second end of the second series element is grounded at the ground 57.

In the above configuration, an operation of the voltage setting circuit is described.

A multiplied reference voltage is output from the output transistor 54 to the first end of the first series element, and the multiplied reference voltage is output from the output terminal 55 as the output voltage $V_O$.

In detail, following values of the output voltage $V_O$ are obtained in cases where one trimming fuse is trimmed (or laser-cut).

$V_O=2*V_{ref}$ (no trimming) (14)

$V_O=5*V_{ref}$ (the trimming fuse 27 is trimmed) (15)

$V_O=(5/2)*V_{ref}$ (the trimming fuse 29 is trimmed) (16)

$V_O=(5/4)*V_{ref}$ (the trimming fuse 28 is trimmed) (17)

$V_O=(5/3)*V_{ref}$ (the trimming fuse 30 is trimmed) (18)

Accordingly, because the voltage multiplying unit is multiplying the first reference voltage value can be obtained in addition to the effect in the first embodiment.

In this embodiment, the multiplied reference voltage is applied to the first end of the first series element. However, the present invention is not limited to this embodiment. For example, in cases where the second end of the second series element is not grounded, it is applicable that a multiplied reference voltage determined by multiplying a second reference voltage is applied to the second end of the second series element. In this case, the output terminal 55 is connected with the second end of the second series element.

EMBODIMENT 6

Figure 7:
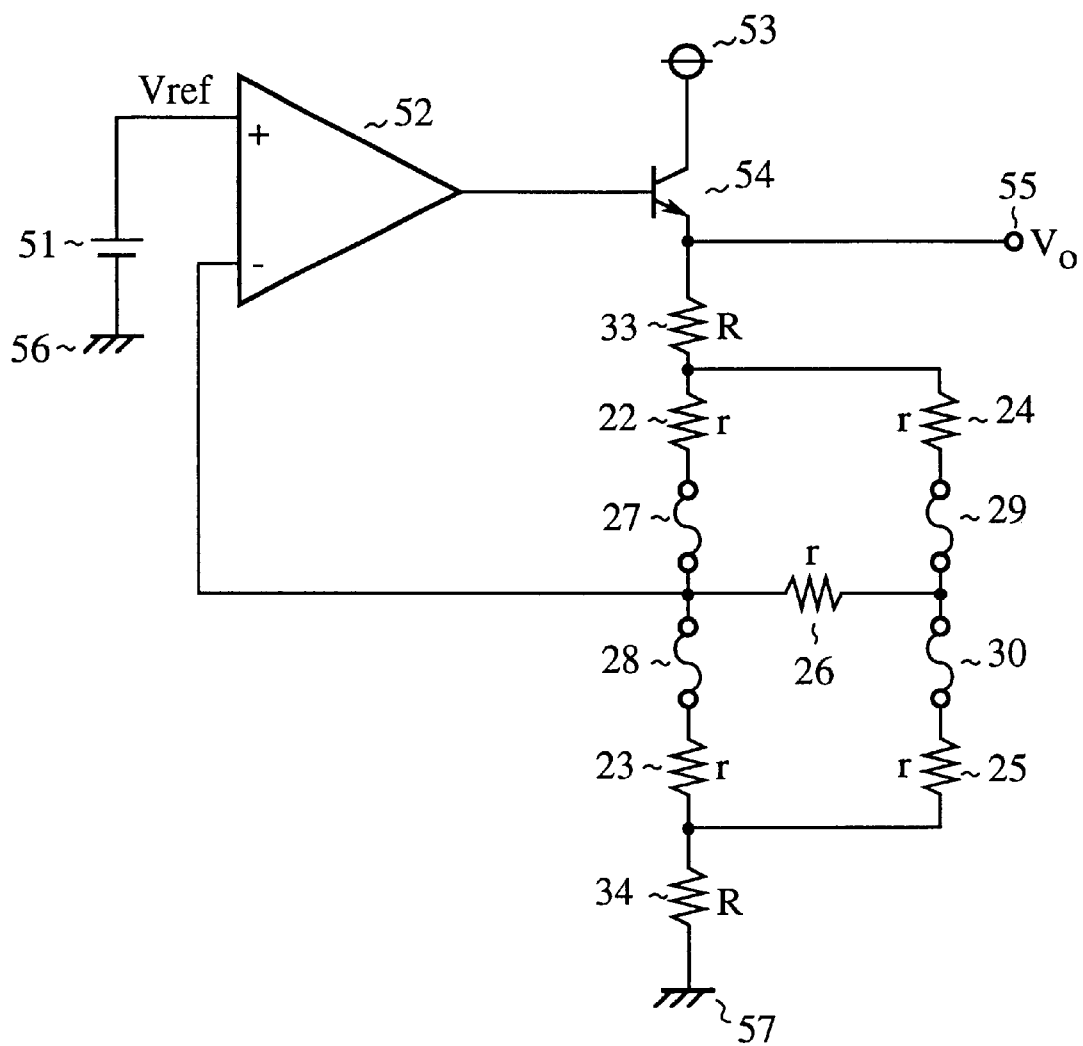
FIG. 7 is a schematic view of a voltage setting circuit according to a sixth embodiment of the present invention.

FIG. 7 is a schematic view of a voltage setting circuit according to a sixth embodiment of the present invention.

As compared with the voltage setting circuit shown in FIG. 2, a voltage setting circuit shown in FIG. 7 further comprises the voltage multiplying unit 51 to 54, wherein a voltage at the first end of the first independent resistor 33 is output from the output terminal 55.

Accordingly, because the voltage multiplying unit is added to the voltage setting circuit of the second embodiment, the output voltage values determined by multiplying the first reference voltage value can be obtained in addition to the effect in the second embodiment.

EMBODIMENT 7

Figure 8:
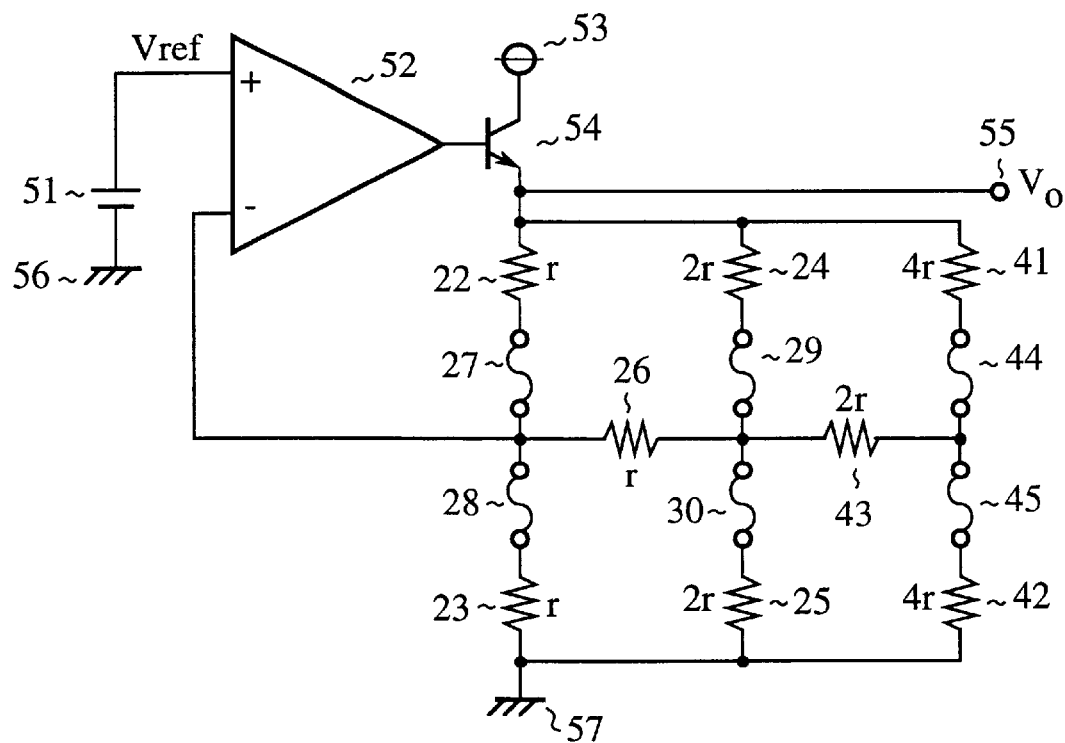
FIG. 8 is a schematic view of a voltage setting circuit according to a seventh embodiment of the present invention.

FIG. 8 is a constitutional view of a voltage setting circuit according to a seventh embodiment of the present invention.

As compared with the voltage setting circuit shown in FIG. 3, a voltage setting circuit shown in FIG. 8 further comprises the voltage multiplying unit 51 to 54, wherein a voltage at the first end of the first series element is output from the output terminal 55.

In this voltage setting circuit, though the number of allowable combinations of trimming fuses (or fuse) trimmed is 48, because the same output voltage value is obtained in a plurality of combinations, the number of effective combinations of trimming fuses (or fuse) trimmed is 35. Because the number of effective combinations is high, the description of the detail calculation for the effective combinations is omitted.

Figure 9:
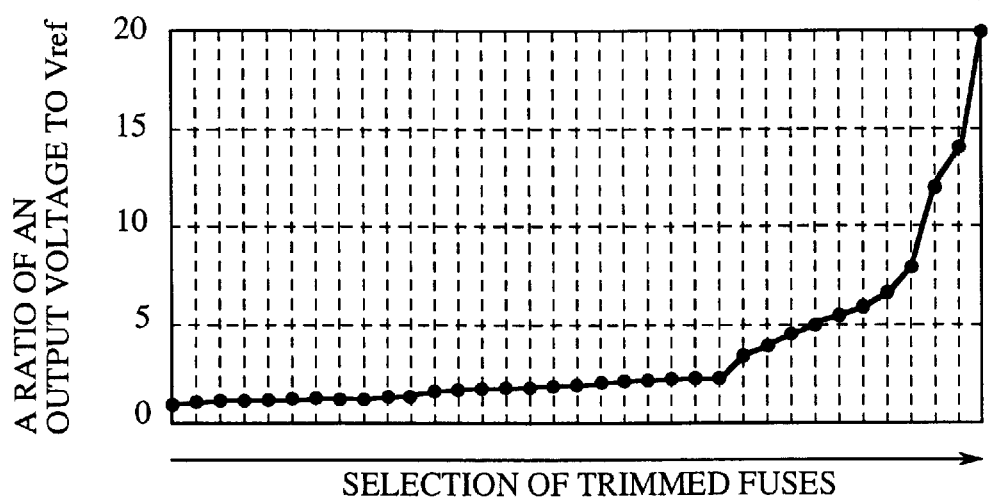
FIG. 9 is a graph showing a ratio of an output voltage to a reference voltage with respect to the effective combinations of trimmed fuses.

FIG. 9 is a graphic view showing a ratio of an output voltage to a reference voltage with respect to the effective combinations of trimmed fuses.

As shown in FIG. 9, a ratio of the output voltage $V_O$ to the reference voltage $V_{ref}$ with respect to the 35 effective combinations is distributed in a range from 1.0526 to 20 and is exponentially increased.

Accordingly, because the voltage multiplying unit is added to the voltage setting circuit in which the number of parallel elements is increased, in cases where a gain of an amplifier is set by using this voltage setting circuit, the choices in the gain can be enlarged in the wide range.

In particular, because the ratio is almost linearly increased in a range from 1.0526 to 2.4, the gain can be minutely set in a narrow range.

EMBODIMENT 8

Figure 10:
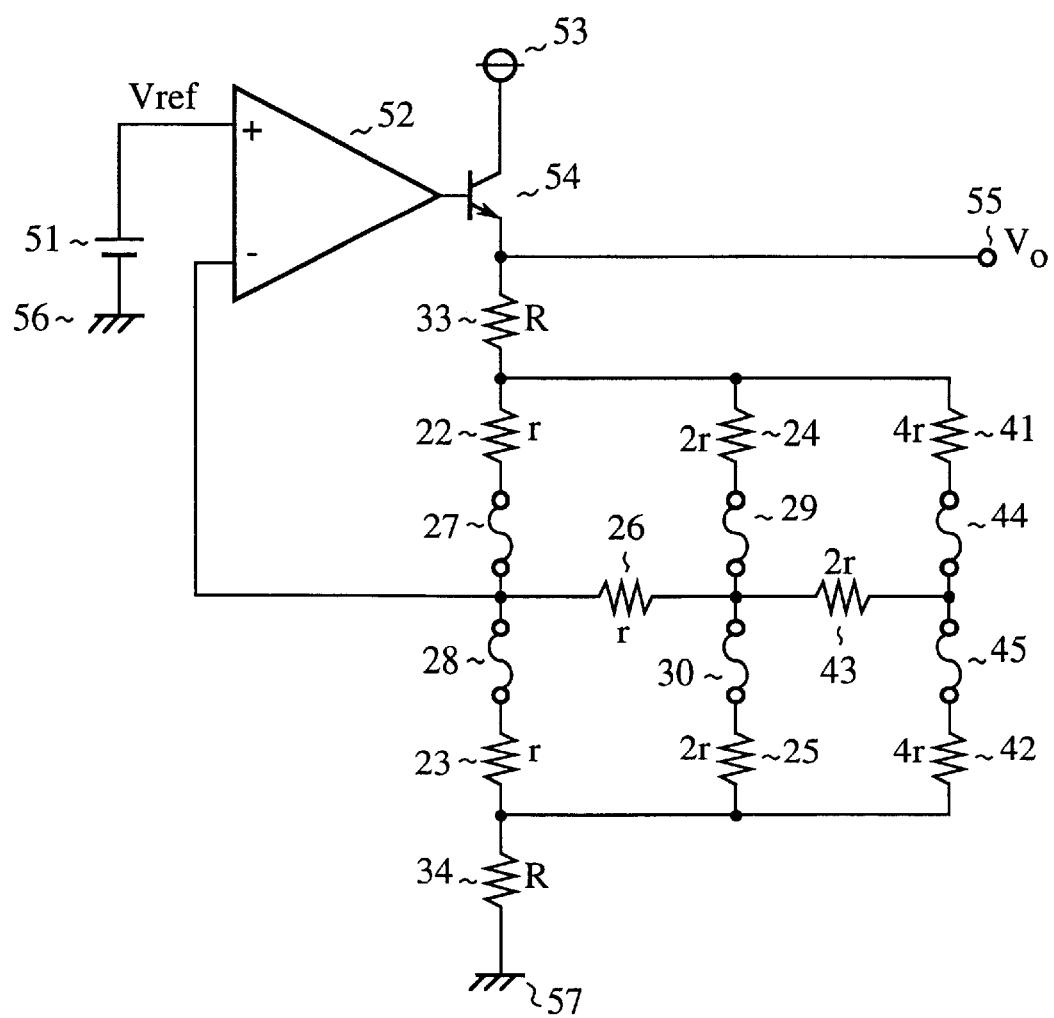
FIG. 10 is a schematic view of a voltage setting circuit according to an eighth embodiment of the present invention.
Figure 11:
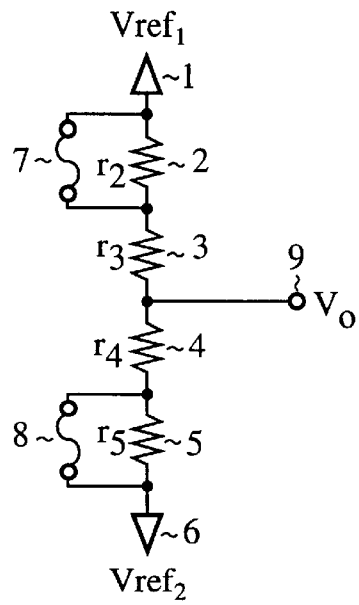
FIG. 11 is a schematic view of a conventional voltage setting circuit.

FIG. 10 is a schematic view of a voltage setting circuit according to an eighth embodiment of the present invention.

As compared with the voltage setting circuit shown in FIG. 5, a voltage setting circuit shown in FIG. 10 further comprises the voltage multiplying unit 51 to 54, wherein a voltage at the first end of the first independent resistor 33 is output from the output terminal 55.

Because a voltage at the second end of the second series element is precisely set, not only the choices in the gain can be enlarged, but also the gain can be precisely set.

What is claimed is:

1. A voltage setting circuit comprising:
   a first series element including a first trimming fuse and a first resistor, a first reference voltage being applied to a first end of the first series element;
   a second series element including a second trimming fuse and a second resistor, a first end of the second series element being connected to a second end of the first series element, and a second reference voltage being applied to a second end of the second series element;
   a third series element including a third trimming fuse and a third resistor, a first end of the third series element being connected to the first end of the first series element;
   a fourth series element including a fourth trimming fuse and a fourth resistor, a first end of the fourth series element being connected to a second end of the third series element, and a second end of the fourth series element being connected to the second end of the second series element;
   a first independent resistor having a first end connected to the second end of the first series element and a second end connected to the second end of the third series element; and
   a voltage output terminal for outputting a voltage at the second end of the third series element.

2. The voltage setting circuit according to claim 1, wherein the first resistor, the second resistor, the third resistor, the fourth resistor and the first independent resistor have the same resistance.

3. The voltage setting circuit according to claim 1, further comprising
   voltage multiplying means for multiplying the first reference voltage or the second reference voltage to a multiplied reference voltage according to a terminal voltage applied to the second end of the first series element, wherein the multiplied reference voltage at the first end of the first series element or at the second end of the second series element is output from the voltage output terminal.

4. The voltage setting circuit according to claim 1, further comprising:
   a fifth series element including a fifth trimming fuse and a fifth resistor, a first end of the fifth series element being connected to the first end of the first series element and the first end of the third series element;
   a sixth series element including a sixth trimming fuse and a sixth resistor, a first end of the sixth series element being connected to a second end of the fifth series element, and a second end of the sixth series element being connected to the second end of the second series element and to the second end of the fourth series element; and
   a second independent resistor having a first end connected to the second end of the third series element and a second end connected to the second end of the fifth series element, wherein the voltage output terminal outputs a voltage at the second end of the fifth series element.

5. The voltage setting circuit according to claim 4, wherein the first and second resistors and the first independent resistor have the same resistance the third and fourth resistors and the second independent resistor have the same resistance, which is twice that of the first and second resistors, and the fifth and sixth resistors have the same resistance, which is four times that of the first and second resistors.

6. The voltage setting circuit according to claim 4, further comprising
   voltage multiplying means for multiplying the first reference voltage or the second reference voltage to a multiplied reference voltage according to a terminal voltage applied to the second end of the first series element, wherein the multiplied reference voltage at the first end of the first series element or at the second end of the second series element is output from the voltage output terminal.

7. A voltage setting circuit comprising:
   a first independent resistor, having a resistance a first reference voltage being applied to a first end thereof;
   a first series element including a first trimming fuse and a first resistor having a resistance lower than that of the first independent resistor, a first end of the first series element being connected to a second end of the first independent resistor;
   a second series element including a second trimming fuse and a second resistor having a resistance lower than that of the first independent resistor, a first end of the second series element being connected to a second end of the first series element, and a second reference voltage being applied to a second end of the second series element;
   a third series element including a third trimming fuse and a third resistor having a resistance lower than that of the first independent resistor, a first end of the third series element being connected to the second end of the first independent resistor;
   a fourth series element including a fourth trimming fuse and a fourth resistor having a resistance lower than that of the first independent resistor, a first end of the fourth series element being connected to a second end of the third series element;
   a second independent resistor having a resistance higher than those of the first, second, third. and fourth resistors, a first end of the second independent resistor being connected to a second end of the second series element and to a second end of the fourth series element;

a third independent resistor having a resistance lower than those of the first and second independent resistors, a first end of the third independent resistor being connected to the second end of the first series element. and a second end of the third independent resistor being connected to the second end of the third series element; and a voltage output terminal for outputting a voltage at the second end of the third series element.

8. The voltage setting circuit according to claim 7, wherein the first resistor, the second resistor, the third resistor, the fourth resistor and the third independent resistor have the same resistance.

9. The voltage setting circuit according to claim 7, further comprising voltage multiplying means for multiplying the first reference voltage or the second reference voltage to a multiplied reference voltage according to a terminal voltage applied to the second end of the first series element, wherein the multiplied reference voltage at the first end of the first independent resistor or at the second end of the second independent resistor is output from the voltage output terminal.

10. The voltage setting circuit according to claim 7, further comprising:

a fifth series element including a fifth trimming fuse and a fifth resistor having a resistance lower than those of the first and second independent resistors, a first end of the fifth series element being connected to the first end of the first series element and to the first end of the third series element;

a sixth series element including a sixth trimming fuse and a sixth resistor having a resistance lower than those of the first and second independent resistors, a first end of the sixth series element being connected to a second end of the fifth series element, and a second end of the sixth series element being connected to the second end of the second series element and to the second end of the fourth series element; and a fourth independent resistor having a resistance lower than those of the first and second independent resistors, a first end of the fourth independent resistor being connected to the second end of the third series element, and a second end of the fourth independent resistor being connected to the second end of the fifth series element, wherein the voltage output terminal outputs a voltage at the second end of the fifth series element.

11. The voltage setting circuit according to claim 10, wherein the first and second resistors and the first independent resistor have the same resistance, the third and fourth resistors and the second independent resistor have the same resistance which is twice as high as that of the first and second resistors, and the fifth and sixth resistors have the same resistance which is four times as high as that of the first and second resistors.

12. The voltage setting circuit according to claim 10, further comprising voltage multiplying means for multiplying the first reference voltage or the second reference voltage to a multiplied reference voltage according to a terminal voltage applied to the second end of the first series element, wherein the multiplied reference voltage at the first end of the first independent resistor or at the second end of the second independent resistor is output from the voltage output terminal.

13. The voltage setting circuit according to claim 1, wherein the trimming fuse and the resistor in each of the first series element, second series element, the third series element, and the fourth series element are serially connected to each other.

14. The voltage setting circuit according to claim 4, wherein the trimming fuse and the resistor in each of the fifth series element and the sixth series element are serially connected to each other.

* * * * *